(12) United States Patent
Brcka et al.

(10) Patent No.: US 6,853,953 B2
(45) Date of Patent: Feb. 8, 2005

(54) METHOD FOR CHARACTERIZING THE PERFORMANCE OF AN ELECTROSTATIC CHUCK

(75) Inventors: Jozef Brcka, Gilbert, AZ (US); Bill Jones, Phoenix, AZ (US); Gert Leusink, Tempe, AZ (US); Jeffrey J. Long, Tempe, AZ (US); Bill Oliver, Phoenix, AZ (US); Charles Tweed, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 409 days.

(21) Appl. No.: 09/924,038

(22) Filed: Aug. 7, 2001

(65) Prior Publication Data

US 2003/0033116 A1 Feb. 13, 2003

(51) Int. Cl.[7] .................................................. G06F 11/30
(52) U.S. Cl. ........................................ 702/182; 700/108
(58) Field of Search ......................... 438/710, 715–717, 438/729; 700/97, 121, 299–300, 32–34, 108–110; 702/33–36, 38, 40, 58–59, 64–65, 115, 117, 130, 133–134, 136, 138, 140, 182–185, 188

(56) References Cited

U.S. PATENT DOCUMENTS

| | | | |
|---|---|---|---|
| 3,443,224 A | | 5/1969 | Kramer et al. ............. 324/72.5 |
| 4,724,393 A | | 2/1988 | Kumada et al. ............. 324/458 |
| 5,213,349 A | * | 5/1993 | Elliott ........................ 279/128 |
| 5,382,311 A | * | 1/1995 | Ishikawa et al. ......... 156/345.54 |
| 5,557,215 A | | 9/1996 | Saeki et al. ................ 324/765 |
| 5,570,031 A | | 10/1996 | Sasaki et al. ............... 324/750 |
| 5,576,629 A | | 11/1996 | Turner et al. ............... 324/709 |
| 5,709,757 A | * | 1/1998 | Hatano et al. ............ 134/22.14 |
| 5,779,925 A | * | 7/1998 | Hashimoto et al. ........... 216/67 |
| 5,820,723 A | * | 10/1998 | Benjamin et al. ....... 156/345.51 |
| 5,841,623 A | * | 11/1998 | Denison et al. ............. 361/234 |
| 5,861,086 A | * | 1/1999 | Khurana et al. ........ 204/192.32 |
| 5,886,865 A | | 3/1999 | Parkhe et al. ............... 361/234 |
| 5,916,689 A | * | 6/1999 | Collins et al. .............. 428/463 |
| 5,917,327 A | | 6/1999 | Haley et al. ................. 324/457 |
| 5,939,886 A | | 8/1999 | Turner et al. ............... 324/464 |
| 5,946,183 A | | 8/1999 | Yamada et al. ............. 361/234 |
| 5,948,704 A | * | 9/1999 | Benjamin et al. ........... 438/715 |
| 5,951,772 A | * | 9/1999 | Matsuse et al. ......... 118/723 R |
| 6,022,458 A | * | 2/2000 | Ichikawa ............... 204/192.23 |
| 6,095,084 A | * | 8/2000 | Shamouilian et al. .... 118/723 E |
| 6,134,096 A | | 10/2000 | Yamada et al. ............. 361/234 |
| 6,149,730 A | * | 11/2000 | Matsubara et al. .......... 118/728 |
| 6,163,448 A | * | 12/2000 | Hausmann ................... 361/234 |
| 6,179,921 B1 | * | 1/2001 | Ruffell et al. ............... 118/715 |
| 6,198,616 B1 | * | 3/2001 | Dahimene et al. .......... 361/234 |
| 6,252,354 B1 | * | 6/2001 | Collins et al. .......... 315/111.51 |
| 6,284,093 B1 | * | 9/2001 | Ke et al. ................ 156/345.51 |
| 6,325,861 B1 | * | 12/2001 | Stinnett ......................... 134/2 |
| 6,377,437 B1 | * | 4/2002 | Sexton et al. ............... 361/234 |
| 6,430,022 B2 | * | 8/2002 | Leeser ........................ 361/234 |
| 6,509,069 B1 | * | 1/2003 | Davenport et al. ......... 427/569 |
| 6,511,712 B1 | * | 1/2003 | Desai et al. ................. 427/466 |
| 6,595,506 B1 | * | 7/2003 | Zide et al. .................... 269/21 |
| 2001/0025691 A1 | * | 10/2001 | Kanno et al. ............... 156/345 |
| 2002/0121345 A1 | * | 9/2002 | Chen et al. ............. 156/345.48 |

* cited by examiner

*Primary Examiner*—Marc S. Hoff
*Assistant Examiner*—Mary Catherine Baran
(74) *Attorney, Agent, or Firm*—Wood, Herron & Evans, L.L.P.

(57) ABSTRACT

A method for characterizing the performance of an electrostatic chuck prior to installing the chuck in the vacuum chamber of a semiconductor processing system in a production line. One or more characteristics of the electrostatic chuck are measured and compared with the known characteristics of a reference chuck. The comparison indicates the performance of the chuck and projects the performance of the chuck in an actual operating environment. The characteristics that are measured include the chuck impedance, the current-voltage characteristic of the chuck, the local plasma density proximate the support surface of the chuck, and the cooling or heating rate of the chuck.

41 Claims, 9 Drawing Sheets

METHOD FOR CHARACTERIZING THE PERFORMANCE OF AN ELECTROSTATIC CHUCK

FIELD OF THE INVENTION

This invention relates to electrostatic chucks and, in particular, to methods for characterizing the performance of an electrostatic chuck before the chuck is installed in a semiconductor processing machine in a production line.

BACKGROUND OF THE INVENTION

Electrostatic chucks are used in the vacuum chambers of semiconductor processing systems and, in particular plasma processing systems, to secure substrates, such as semiconductor wafers, in a stationary position during a processing step. An electrostatic chuck incorporates one or more electrodes embedded within a dielectric body. A chucking voltage is applied to the electrodes that, by operation of Coulomb's law, establishes a clamping force that attracts the substrate to the surface of the electrostatic chuck. Certain electrostatic chucks provide an attractive clamping force arising from operation of the Johnsen-Rahbek effect. The performance of the electrostatic chuck slowly deteriorates over time such that the clamping force is no longer adequate when the clamping voltage is applied or such that the substrate is not promptly released or dechucked after the chucking voltage is removed.

Significant difficulties arise when an electrostatic chuck having unknown characteristics is initially installed as a replacement for an originally-installed electrostatic chuck in a semiconductor processing system performing a process step or steps in a production line. Specifically, the performance of the replacement chuck may differ from the performance of the originally installed chuck. The replacement chuck should provide substantially the same chucking performance when a chucking voltage is applied and substantially the same dechucking performance when the chucking voltage is removed in comparison with the originally installed chuck in its unused initial state. Moreover, the replacement electrostatic chuck should provide a similar process uniformity as the chuck that it replaced. It is known that processing uniformity varies across the surface of the substrate if the chuck electrode does not deliver the RF power with spatial uniformity to the support surface. The properties of the chuck electrode can vary due to differences introduced during the manufacturing process of various electrodes. If the replacement electrostatic chuck has an inferior performance that is undetected before installation, the chuck is a likely candidate to fail prematurely under normal operating conditions.

Because of the inherent unpredictability in performance, a technician must calibrate the replacement electrostatic chuck after it is installed in the semiconductor processing system and before it is initially used to secure substrates for processing. The calibration procedure idles the processing system for a time sufficient to optimize the performance of the electrostatic chuck. Unless the operational parameters are optimized before initial use, the replacement chuck may not adequately chuck a substrate or, after a chucking voltage is applied and the substrate processed, the replacement chuck may slowly dechuck substrates. If the performance of the electrostatic chuck is known before the chuck is installed in the process chamber, the calibration procedure is significantly simplified and expedited.

Antecedent knowledge of the chuck performance may provide information that can predict the lifetime of the chuck while in service. An electrostatic chuck that exhibits poor initial performance may later prematurely fail and damage either the processing system or the wafer being processed. A failed chuck must be replaced or repaired, which requires idling the processing system. Shutdowns are costly as the downtime has a ripple effect along the production line that significantly decreases the productivity of the production line and increases maintenance costs.

Limited performance testing of the replacement electrostatic chuck may be performed ex-situ on a benchtop before installing the chuck in a semiconductor processing system in a production line. However, the benchtop environment cannot accurately simulate the environment that the chuck would experience within the vacuum chamber and does not expose the chuck to a realistic environment during testing. Because of the significant differences between a benchtop environment and the environment inside an evacuated semiconductor processing system, ex-situ measurements of chuck performance may not accurately predict the performance in the process chamber and under processing conditions. Additional variables, such as exposing the electrostatic chuck to a plasma during testing or heating the chuck to an operating temperature in a vacuum environment, can influence the chuck performance and may provide additional insights into the chuck performance.

With growing requirements for improved diagnostic information regarding the performance of an electrostatic chuck, an objective of this invention is to provide methods to predict the performance of an electrostatic chuck, before the chuck is installed in the vacuum chamber of a semiconductor processing system in a production line, and to use the predicted performance to select chucks having a suitable level of performance.

SUMMARY OF THE INVENTION

The foregoing objective has been accomplished, according to the present invention, by providing a method of characterizing the performance of an electrostatic chuck comprising positioning the electrostatic chuck within a first vacuum chamber and measuring a measured value for a performance characteristic of the electrostatic chuck. The measured value of the performance characteristic is compared with a reference value of the performance characteristic, m which the reference value as correlated with satisfactory performance of a reference electrostatic chuck when placed in a second vacuum chamber of a semiconductor processing system in a production line and operated under standard conditions of operation. The comparison indicates the performance of the electrostatic chuck. Based on the result of the comparing step, it is determining whether the performance of the electrostatic chuck is adequate to install the electrostatic chuck in the second vacuum chamber of the semiconductor processing system in the production line.

The foregoing objective has been also accomplished, according to the present invention, by providing a method of characterizing the performance of an electrostatic chuck comprising positioning the electrostatic chuck within a first vacuum chamber, selecting a plurality of frequencies within a defined frequency range, applying a signal across an electrode of the chuck at each of the plurality of frequencies, one frequency at a time, and measuring the impedance of the chuck in response to the signal at each of the plurality of frequencies to generate a set of actual impedances. A set of target impedances is provided which defines a reference impedance level correlated with satisfactory performance of a reference electrostatic chuck when placed in a second vacuum chamber of a semiconductor processing system in a production line and operated under standard conditions of operation. The set of actual impedances is compared with the set of target impedances for the range of frequencies, in which the comparison provides an indication of the performance of the electrostatic chuck. Based on the result of the comparing step, a determination is made whether the performance of the electrostatic chuck is adequate to install the electrostatic chuck in the second vacuum chamber of the semiconductor processing system in the production line.

The foregoing objective has been also accomplished, according to the present invention, by providing a method of characterizing the performance of an electrostatic chuck comprising positioning the electrostatic chuck within a first vacuum chamber, selecting a range of voltages, applying each voltage to the electrode, one voltage at a time, and measuring the current flowing to the electrode in response to each applied voltage to provide a set of actual currents. A set of target currents is provided which defines a reference leakage current level correlated with satisfactory performance of a reference electrostatic chuck when placed in a second vacuum chamber of a semiconductor processing system in a production line and operated under standard conditions of operation. The set of actual currents is compared with the set of target currents for the range of voltages, in which the comparison provides an indication of the performance of the electrostatic chuck. Based on the result of the comparing step, a determination is made whether the performance of the electrostatic chuck is adequate to install the electrostatic chuck in the second vacuum chamber of the semiconductor processing system in the production line.

The foregoing objective has been also accomplished, according to the present invention, by providing a method of characterizing the performance of an electrostatic chuck comprising positioning the electrostatic chuck within a first vacuum chamber, placing a substrate on a support surface of the chuck, and selecting a predetermined position proximate the exposed surface of the substrate. An electrode of a Langmuir probe is positioned adjacent to the predetermined position and a collection voltage is applied to the electrode. The current flowing from the plasma to the Langmuir probe is measured with the probe stationary at the predetermined position. A target current is provided which defines a reference current level correlated with satisfactory performance of a reference electrostatic chuck when placed in a second vacuum chamber of a semiconductor processing system in a production line and operated under standard conditions of operation. The measured current is compared with the target current, in which the comparison indicates the performance of the electrostatic chuck. Based on the result of the comparing step, a determination is made whether the performance of the electrostatic chuck is adequate to install the electrostatic chuck in the second vacuum chamber of the semiconductor processing system in the production line.

The foregoing objective has also been accomplished, according to the present invention, by providing a method of characterizing the performance of an electrostatic chuck comprising positioning the electrostatic chuck within a first vacuum chamber, establishing the temperature of the chuck at a predetermined temperature, discontinuing the temperature regulation of the electrostatic chuck, and measuring the change, which may be a decrease or increase, in the temperature of the chuck as a function of time to create a temperature profile. A target temperature profile is provided which defines a reference temperature profile correlated with satisfactory performance of a reference electrostatic chuck when placed in a second vacuum chamber of a semiconductor processing system in a production line and operated under standard conditions of operation. The measured temperature profile is compared with a target temperature profile, in which the comparison provides an indication of the performance of the electrostatic chuck. Based on the result of the comparing step, a determination is made whether the performance of the electrostatic chuck is adequate to install the electrostatic chuck in the second vacuum chamber of the semiconductor processing system in the production line.

By virtue of the foregoing, there are provided methods to permit the performance of an electrostatic chuck to be compared with a target performance characteristic of an existing chuck exhibiting a suitable performance. The methods permit the performance of the electrostatic chuck to be predicted before the chuck is actually installed in the vacuum chamber of a processing system in a production line.

The methods of the present invention can be used with any type of electrostatic chuck, including monopolar and bipolar Johnsen-Rahbek chucks and Coulombic chucks. The present invention permits the performance of an electrostatic chuck, such as an electrical characteristic, to be determined before the chuck is installed in the vacuum chamber of a semiconductor processing system in a production line. The antecedent determination of the performance reduces the likelihood that the electrostatic chuck will malfunction and damage the semiconductor processing system or the substrate being processed by the system. Because the performance of the electrostatic chuck is known before installation, the chuck can be replaced and calibrated in a significantly reduced amount of time. This increases the productivity of the production line and reduces the costs associated with the processing of each substrate. The measurement of the chuck performance permits the selection of electrostatic chucks that will likely have a longer projected lifetime.

BRIEF DESCRIPTION OF THE DRAWINGS

Various advantages, objectives, and features of the invention will become more readily apparent to those of ordinary skill in the art upon review of the following detailed description of the preferred embodiments, taken in conjunction with the accompanying drawings.

DETAILED DESCRIPTION

The present invention provides methods to measure one or more performance characteristics of an electrostatic chuck and compare those performance characteristics with the target performance characteristic of a reference electrostatic chuck exhibiting an acceptable performance. The methods of the present invention predict the performance of the electrostatic chuck before it is actually installed in the vacuum chamber of a processing system in a production line.

The methods of the present invention can be used to determine the performance of any type of electrostatic chuck, including monopolar and bipolar Johnsen-Rahbek chucks and Coulombic chucks. The present invention permits the performance of the electrostatic chuck to be qualified before the chuck is installed in the vacuum chamber of a semiconductor processing system in a production line. The qualification of the performance reduces the likelihood that a malfunction of the electrostatic chuck will damage the semiconductor processing system or the substrate being processed by the system. Because the performance of the electrostatic chuck is known before installation, the time required to replace a chuck and to calibrate the chuck for use will be significantly reduced. In addition, measurement of the chuck performance permits electrostatic chucks to be selected that will likely have a longer projected lifetime.

Figure 1:
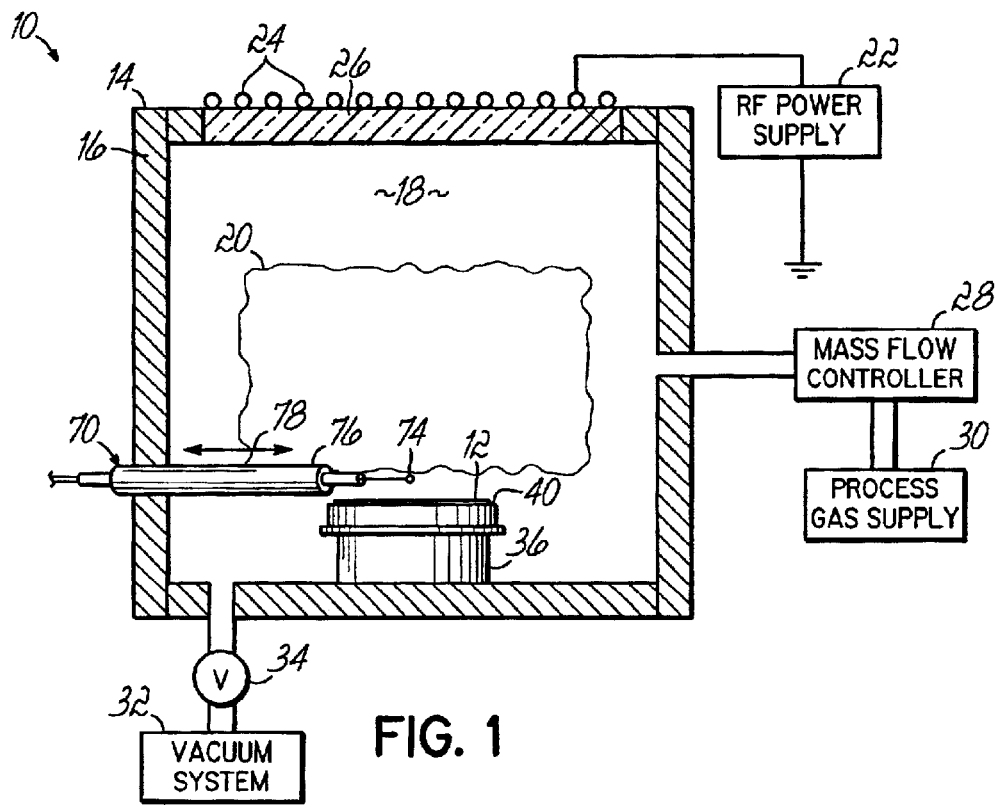
FIG. 1 is a schematic representation of a semiconductor processing system having an electrostatic chuck and adapted according to principles of the present invention.

With reference to FIG. 1, a semiconductor processing system 10 or like machine operable for treating a substrate 12, such as a semiconductor wafer, with a plasma is illustrated. Processing system 10 includes a vacuum chamber 14 having a chamber wall 16 that encloses a vacuum processing space 18. A plasma 20 is generated in a portion of the vacuum processing space 18 to process an exposed surface of the substrate 12. To that end, the processing system 10 is provided with an RF power supply 22 electrically connected in a known manner with an impedance matching network to an antenna 24. The antenna 24 is formed of an electrically conductive material and the coils of the antenna are positioned adjacent to a planar dielectric window 26 which forms a sealed portion of the chamber wall 16. The dielectric window 26 is formed of a dielectric material, such as aluminum oxide, that transmits RF power emanating from the antenna 24 into the vacuum processing space 18. The transmitted RF power inductively couples with a rarified atmosphere of a process gas selectively provided from a process gas supply 28. Typically, the RF power supply 22 operates at a frequency of between about 440 kHz and about 13.56 MHz and outputs an RF power of up to about 5000 watts. A mass flow controller 30 regulates the flow rate of process gas from the process gas supply 28. The mass flow controller 30 receives information from a pressure gauge (not shown) regarding the vacuum level inside the vacuum processing space 18 and adjusts the flow rate of process gas according to the measured vacuum level. A vacuum system 32 is in fluid communication with the vacuum chamber 14 for evacuating the vacuum processing space 18. The vacuum system 32 has a pumping speed that is controllable by throttling an adjustable vacuum valve 34. Under normal operating conditions with a plasma present in the vacuum processing space 18, the pressure in the vacuum processing space 18 is between about 0.5 mTorr and about 100 mTorr, preferably about 10 mTorr. Supplying a controlled flow of process gas and throttling the pumping speed continuously refreshes the process gas and maintains the desired pressure in vacuum processing space 18. Such a processing system 10 is the model PCM etch system manufactured by Tokyo Electron Arizona, Inc. (Gilbert Ariz.).

An electrostatic chuck (ESC) 36 of a conventional design is removably mountable within the vacuum chamber 14 and is shown in a mounted position in FIG. 1. The electrostatic chuck 36 is used to heat or cool the substrate 12, electrically bias the substrate 12, and support the substrate 12 in a stationary state proximate the plasma 20 in the vacuum processing space 18.

Figure 2:
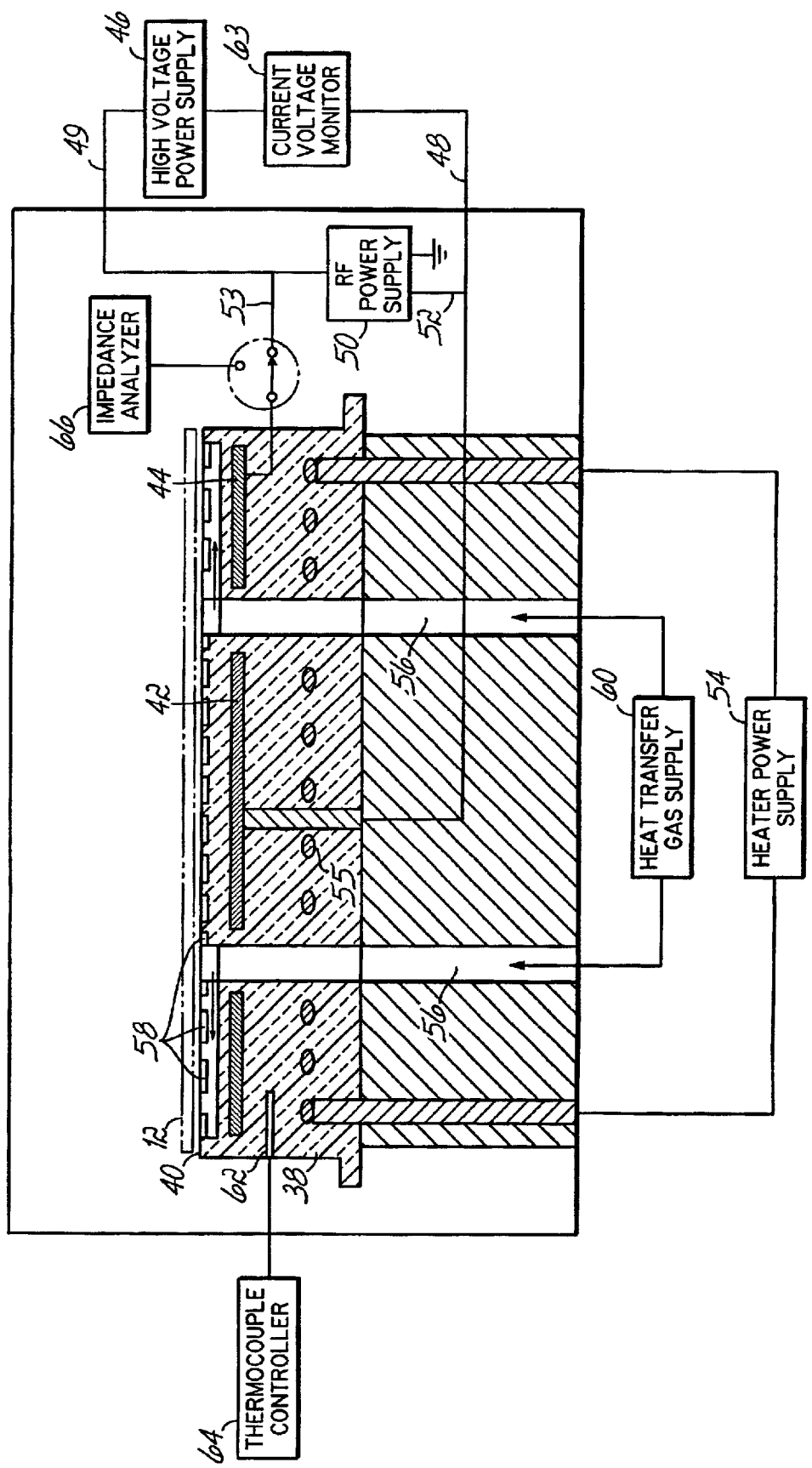
FIG. 2 is a cross-sectional diagrammatic view of a portion of the semiconductor processing system of FIG. 1.

With reference to FIG. 2, the electrostatic chuck 36 includes a dielectric body 38 having a support surface 40 that receives the substrate 12. The dielectric body 38 is fabricated of a ceramic material, such as an aluminum nitride, that has a high electrical resistivity and a suitable thermal conductivity. Embedded within the dielectric body 38 are a disk-shaped inner electrode 42 and an annular outer electrode 44 that encircles the inner electrode 42. The outer electrode 44 is substantially concentric with the inner electrode 42 and each of the electrodes 42, 44 is formed of a metal such as molybdenum. The inner electrode 42 is electrically isolated from the outer electrodes 44, so that electrodes 42, 44 can serve as opposite poles of electrostatic chuck 36 in a bipolar configuration. The outputs of a variable, high-voltage power supply 46 are electrically coupled via shielded transmission lines 48, 49 to the electrodes 42, 44 to provide a DC bias potential or clamping voltage. Typically, the high-voltage power supply 46 is cabled such that the inner electrode 42 is positively biased and the outer electrode 44 is negatively biased. The oppositely-charged inner and outer electrodes 42,44 establishes a potential difference between the substrate 12 and the electrodes 42,44 that electrostatically secures the substrate 12 to the support surface 40 with a clamping farce proportional to the characteristics of the electrostatic chuck 36 and the applied clamping voltage. The high-voltage power supply 46 is operable to supply a clamping voltage between about negative 1500 volts and about positive 1500 volts.

Although electrostatic chuck 36 is illustrated in FIG. 2 as a bipolar chuck and the discussion below describes the present invention in the context of a bipolar chuck of a Johnsen-Rahbek design, the present invention is not so limited and is applicable to measure the performance of electrostatic chucks 36 with alternative electrode structures, such as monopolar chucks of a Johnsen-Rahbek design and Coulombic chucks. Conventional Johnsen-Rahbek chucks are illustrated in U.S. Pat. Nos. 6,134,096 and 5,946,183. The disclosure of each patent is hereby incorporated by reference herein in its entirety.

An RF power supply 50 is electrically coupled via a pair of shielded transmission lines 52, 53 to the electrodes 42, 44 to provide a time-dependent DC bias, in addition to the clamping DC voltage supplied by high voltage power supply 46. The time dependent DC bias attracts ions and radicals from the plasma to the exposed surface of the substrate 12. The RF power supply 50 typically operates at a frequency of about 13.56 MHz and a power level of less than about 500 watts, typically about 100 watts.

Embedded within the dielectric body 38 is a resistive heating element 55, having the form of a grid mesh, electrically connected to a suitable heater power supply 54. The heating element 55 is electrically isolated from the electrodes 42, 44, and other portions of the electrostatic chuck 36, by the intervening thicknesses of the dielectric material of the dielectric body 38. The resistive heating element 55 thermally dissipates electrical energy provided from the heater power supply 54 by Joule heating to heat the dielectric body 38. Heat energy is conducted from the heating element 55 through the dielectric body 38 to the support surface 40 and to substrate 12 resting on the support surface 40. The temperature of the substrate 12 is regulated by varying the current from the heater power supply 54 to the heating element 55. Typically, the substrate 12 is held at a specific predetermined temperature during processing selected to ensure uniform and repeatable etching and deposition of materials.

A pair of gas passageways 56 extend through the dielectric body 38 to communicate at one end with a network of interconnected gas channels 58 on the surface of the dielectric body 38. Gas channels 58 direct a heat transfer gas, such as helium or argon, between the support surface 40 and the facing surface of the substrate 12. The other end of each gas passageway 56 communicates with appropriate gas lines leading to a heat transfer gas supply 60. The presence of the heat transfer gas promotes the uniform and efficient transfer of heat energy between portions of the support surface 40 and the substrate 12 that are not in actual physical contact by providing an efficient heat transfer medium. To optimize the transfer of heat between the substrate 12 and support surface 40, the electrostatic force should be approximately uniform to cause a significant portion of the facing surface of the substrate 12 to physically contact the support surface 40 and to contact the surface 40 with a substantially uniform force. The significant physical contact between support surface 40 and substrate 12 also limits the leakage of heat transfer gas from beneath the substrate 12 to maintain a suitable heat transfer gas pressure and improves the transfer of heat therebetween.

A thermocouple 62 is positioned within the dielectric body 40 and is cabled to a thermocouple controller 64 that converts signals from the thermocouple 62 to provide an indication of the temperature of the dielectric body 38 near the thermocouple 62. The temperature of the dielectric body 38 approximates the temperature of the substrate 12 and is furnished as feedback to heater power supply 54 for regulating the temperature of substrate 12. It is understood that the electrostatic chuck 36 can be configured with a portion that receives a cooling fluid for use in regulating the temperature of the chuck 36.

The heat transfer gas, typically supplied at a pressure of about 1 Torr to about 10 Torr, also applies a force due to the pressure differential between the gas pressure and the pressure within the vacuum processing space 18 (FIG. 1) which, as mentioned above, is between about 5 mTorr and about 30 mTorr. The force applied by the heat transfer gas acts to displace the substrate 12 from the support surface 40. To counteract this force, pressure, the clamping voltage applied to the electrodes 42, 44 of the electrostatic chuck 36 must supply an attractive electrostatic force of a magnitude sufficient to secure the substrate 12 to the support surface 40.

The present invention measures one or more characteristics of the electrostatic chuck 36 and compares the measured characteristics with the known characteristics or target performance of a reference electrostatic chuck, substantially similar in construction and/or configuration to chuck 36, to ascertain the performance of the chuck 36. The measured performance is used to project the performance of the chuck 36 in a vacuum chamber of a semiconductor processing system in a production line. The characteristics measured include the impedance of the chuck 36, the current-voltage characteristic of the chuck 36, the local plasma density proximate the support surface 40 of the chuck 36, the cooling or heating rate of the chuck 36, and various combinations thereof. The measured performance of the chuck 36 may indicate electrical performance for chucking a substrate 12 during processing or for releasing a substrate 12 after processing, the ability of the chuck 36 to uniformly attract ions and radicals to the exposed surface of the substrate 12, and other related characteristics. The target performance provides a reference level correlated with satisfactory performance of a reference electrostatic chuck when placed in a vacuum chamber of a semiconductor processing system in a production line and operated under standard conditions of operation.

According to one aspect of the present invention, the performance of the electrostatic chuck 36 may be qualified by measuring the leakage current flowing between the electrodes 42, 44 as a function of applied voltage. A suitable current-voltage monitor 63 is installed in the shielded transmission lines leading from the high-voltage DC power supply 46 to the electrodes 42, 44. It is understood by persons of ordinary skill in the art that the current-voltage monitor 63 may be integral with the high-voltage DC power supply 46. The current sensing circuit of the current-voltage monitor 63 should be sensitive in the 0 milliampere to 20 milliampere range and the voltage sensing circuit of monitor 63 should be sensitive over a voltage range of about negative 1500 volts to about positive 1500 volts. This voltage range corresponds to the range of clamping voltages that are typically applied to the electrodes 42, 44 of the electrostatic chuck 36. The current-voltage monitor 63 should have a display device capable of presenting the current-voltage measurements in a manner compliant with making a comparison between the current-voltage characteristics of various chucks 36 and may include a memory for storing an array of measurements. It is apparent that the current-voltage monitor 63 may be interfaced with a microcomputer (not shown) to facilitate measurement and comparison.

To perform the current-voltage measurement on electrostatic chuck 36 that is bipolar, as depicted in FIG. 2, a voltage is applied from the high-voltage power supply 46 to the electrodes 42, 44. The power to the heating element 55 is adjusted to heat the electrostatic chuck 36 to a fixed constant temperature, for example, about 200° C. The leakage current flowing to the commonly-connected electrodes 42, 44 is recorded as a function of the applied voltage over a bipolar range of voltages that roughly corresponds to the expected operating voltage range of the electrostatic chuck 36. The shape of the current-voltage curve indicates the current-voltage performance of the electrostatic chuck 36 over the predetermined voltage range of applied voltages. Deviations of the performance from the expected performance may suggest, for example, excessive amounts of impurities in material forming the dielectric body 38, a faulty chuck component or improper assembly of the chuck components.

The measurement of the current-voltage performance may be measured under various conditions, such as with or without substrate 12 present on the support surface 40. Alternatively, the electrostatic chuck 36 may be heated to each of a series of temperatures and the current-voltage performance measured at each temperature in the series. The electrical resistance of the electrostatic chuck 36 is known to vary as a function of temperature. As another alternative for the measurement of the current-voltage performance, a stable plasma may be provided in the vacuum processing space 18 with the RF power supply 22 operating at a known power level of, for example, about 500 watts to about 750 watts and a process gas of a specific gas mixture provided at a given pressure, for example, about 1 mTorr to about 200 mTorr, in the vacuum processing space 18. For example, before acquiring the current-voltage data, a plasma can be generated from 10 mTorr of Argon at 750 watts of RF power or generated from 100 mTorr of 96% Helium: 4% Hydrogen at 600 watts of RF power. Testing in the presence of a plasma recognizes that the performance of the electrostatic chuck 36 varies considerably during a given process sequence or recipe. Combinations of these various testing conditions are contemplated by the present invention.

Examples of a current-voltage performance comparison of a defective electrostatic chuck with an electrostatic chuck of similar or identical construction and/or configuration having an acceptable performance are illustrated with reference to FIGS. 3 and 4. The magnitude of the measured leakage current is displayed along the left ordinate versus voltage applied to the electrodes along the abscissa in which the measurements were taken with the electrostatic chuck at 200° C. The voltage to the electrodes of each chuck is ramped in discrete voltage increments, such as about 50 volts, from about negative 1000 volts to about positive 1000 volts and the current is monitored that flows in the circuit that includes the electrodes. Curve 100 represents a plot of the leakage current as a function of the applied voltage for an electrostatic chuck having an expected performance. It can be observed that the leakage current increases approximately linearly over the range of applied voltage and is bounded between about negative 1.5 milliAmps and about positive 2 milliAmps over the voltage range. Curve 102 represents a plot of the current as a function of applied voltage for an electrostatic chuck having a performance symptomatic of an abnormality or defect, such as in the material, construction, or assembly of the chuck. It is observed that Curve 102 is linear and has a slope similar to the slope of Curve 100 over the voltage range from about negative 1000 volts to about positive 450 volts. Curve 102 is offset from Curve 100 such that, at an applied voltage of 0 volts, for example, a significant leakage current is measured in the defective chuck. At an applied voltage of about 450 volts, it is apparent that the leakage current begins to deviate from the initial linear dependance and increases linearly with a much greater new slope. At an applied voltage of about 1000 volts, for example, the defective chuck exhibits a leakage current in Curve 102 that is almost an order of magnitude greater than the leakage current of the chuck with acceptable performance in Curve 100.

Figure 3:
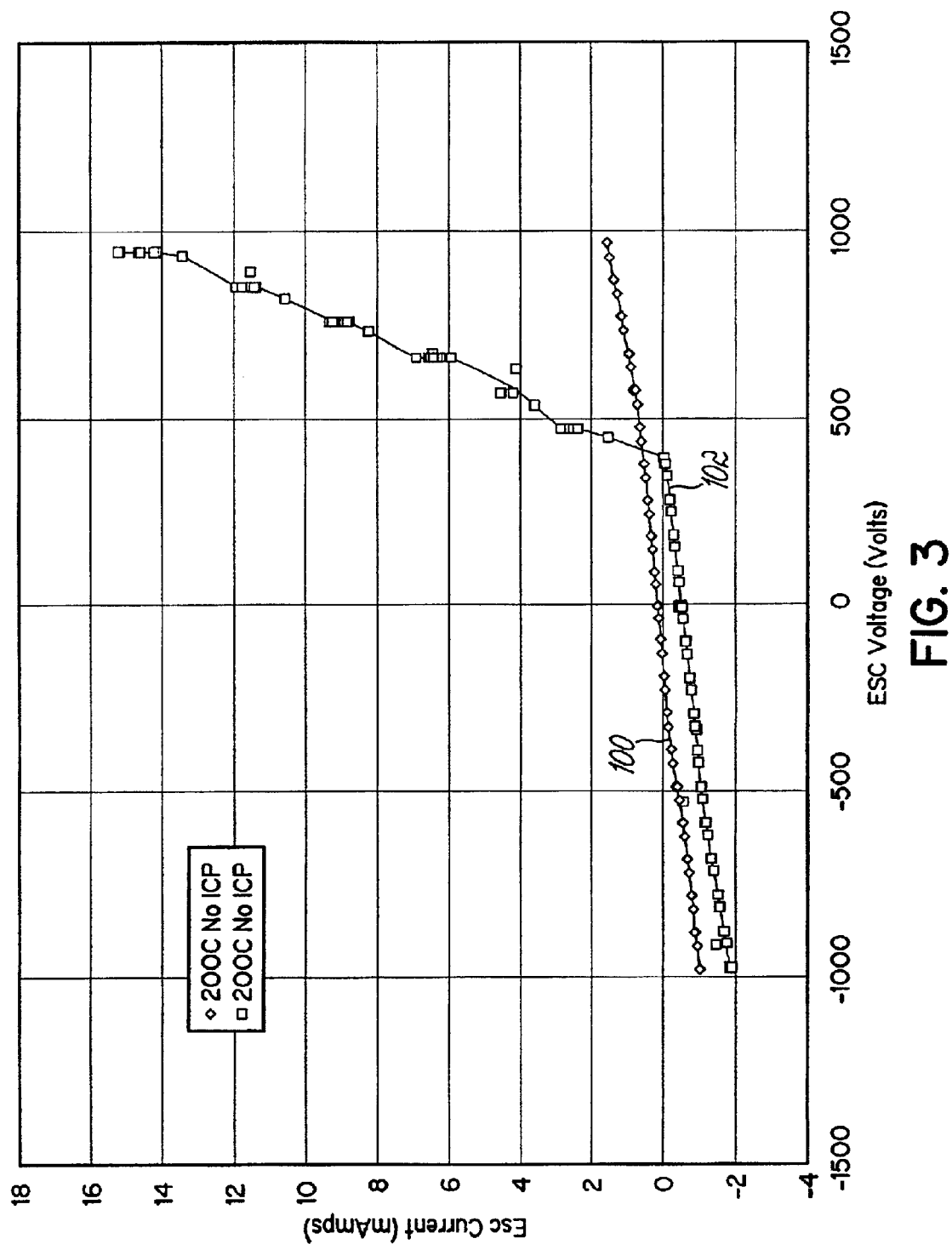
FIG. 3 is a graphical representation of the magnitude of the current flowing to the chuck electrode as a function of applied voltage.

An abrupt increase in the leakage current, such as that exhibited by the defective chuck in Curve 102 of FIG. 3 over the range of about positive 450 volts to about positive 1000 volts, is frequently caused by an irregularity in the dielectric material forming the electrostatic chuck. The occurrence of the enhanced leakage current clearly distinguishes the chuck associated with Curve 102 from a chuck having an acceptable performance. The significant difference between the mathematical dependence of the current-voltage performance of a chuck having an acceptable performance, such as the chuck associated with the measurements of Curve 100, and the mathematical dependence of the current-voltage performance of a defective chuck, such as the chuck associated with Curve 102, permits defective chucks to be identified for quality control to avoid installing a defective chuck in a semiconductor processing machine in a production line.

Figure 4:
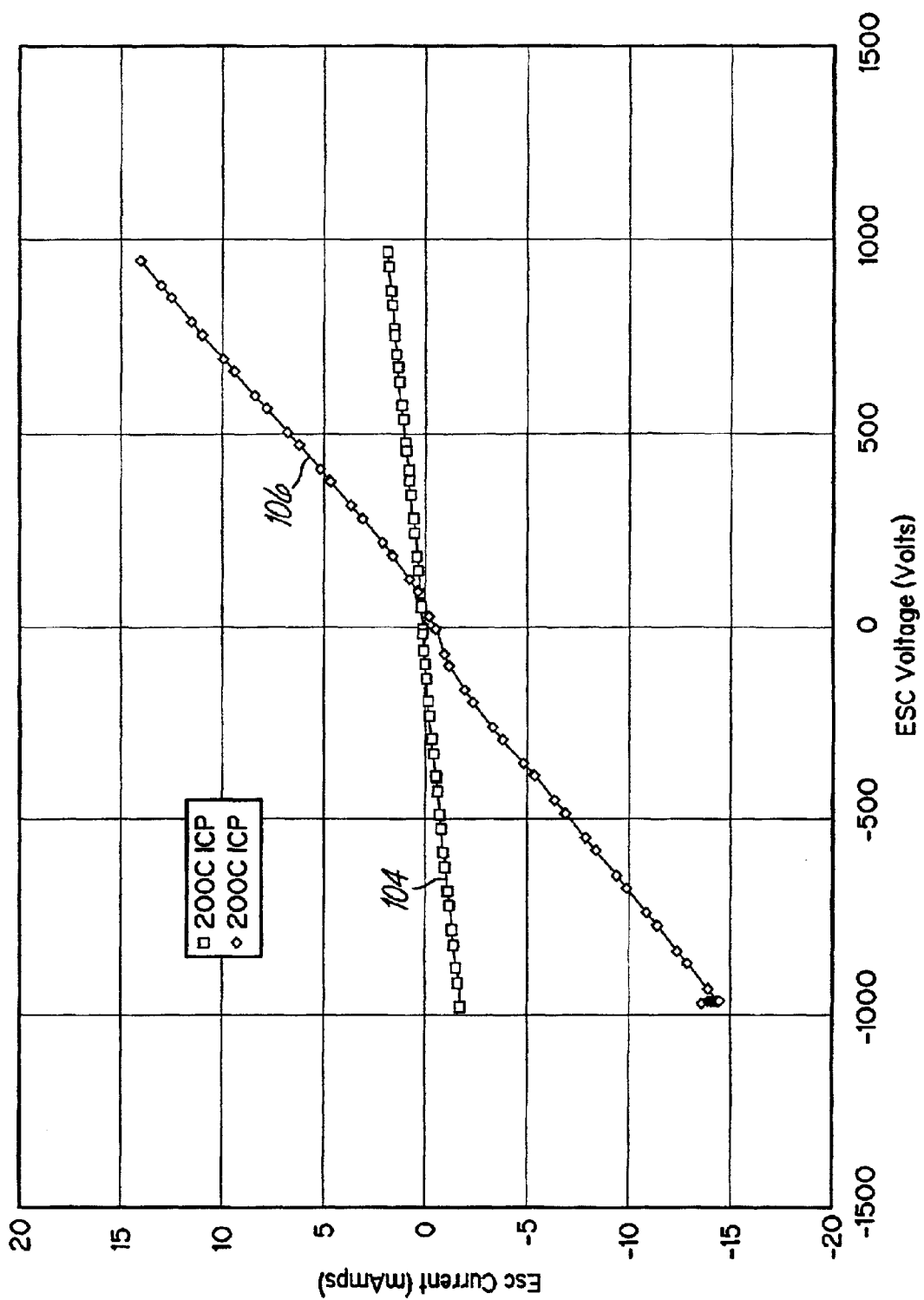
FIG. 4 is a graphical representation of the magnitude of the current flowing to the chuck electrode as a function of applied voltage, in which a plasma is provided in the processing chamber of the semiconductor processing system.

With reference to FIG. 4, the magnitude of the measured electrical current is displayed along the left ordinate versus voltage applied to the electrodes 42, 44 along the abscissa, wherein the measurements were taken with the electrostatic chuck at 200° C. and with a plasma present in the vacuum processing space 18. Once a plasma has formed in the vacuum processing space 18 above the substrate 12, the plasma self biases the substrate 12 to a DC potential related to the fundamental characteristics of the plasma. Curve 104 represents a plot of the current as a function of the applied voltage for an electrostatic chuck having an expected performance and is similar to Curve 100 (FIG. 3). It can be observed that the leakage current increases approximately linearly over the range of applied voltage and is bounded between about negative 2 milliAmps and about positive 2 milliAmps over the voltage range. Curve 106 represents a plot of the current as a function of applied voltage for an electrostatic chuck having a performance symptomatic of an abnormality or a defect. The electrostatic chuck is the same electrostatic chuck for which Curve 102 (FIG. 3) was acquired. Although the current of each curve has a linear dependence upon the applied voltage, it is apparent that Curve 106 has a significantly greater slope than Curve 104. At the maximum positive and negative applied voltages, the leakage current exhibited by the defective chuck in Curve 106 is roughly an order of magnitude larger than the leakage current of the chuck having the acceptable performance illustrated in Curve 104. It is apparent from the significant difference in the mathematical dependence of the leakage current as a function of applied voltage that a defective chuck, such as the chuck associated with Curve 106, can be distinguished from a chuck having an acceptable performance, such as the chuck associated with Curve 104.

According to another aspect of the present invention, the performance of the electrostatic chuck 36 may be qualified by measuring the impedance of the chuck 36 over a suitable frequency range. With reference to FIG. 2, the shielded transmission lines 52, 53 leading to the RF power supply 50 are disconnected and reconnected to the inputs of an impedance analyzer 66. The impedance analyzer 66 may be any device or system equipped for measuring a broad range of impedance values with high precision and over a broad frequency band. A suitable impedance analyzer 66 is model No. 4396, available from Agilent Technologies (Palo Alto, Calif.), which may be interfaced with a computer system (not shown) for microprocessor control to facilitate measurement and comparison. The impedance analyzer 66 includes a display device capable of presenting the current-voltage measurements in a manner compliant with making a comparison between the current-voltage characteristics of various chucks 36 and may include a memory for storing an array of measured impedance values.

Before acquiring the impedance data, the vacuum processing space 18 is evacuated to a vacuum level of less than about 0.1 mTorr and the electrostatic chuck 36 is at ambient temperature. The impedance of the electrostatic chuck 36 is measured by applying an excitation signal with voltage of constant amplitude and measuring the magnitude and phase of the resultant current while varying the frequency in discreet increments over a predetermined frequency range, such as a frequency range between about 400 kHz and about 60 MHz. The magnitude or phase angle of the impedance data is compared with the expected frequency-dependent behavior of the impedance of a known electrostatic chuck, substantially similar to chuck 36, or a series of known electrostatic chucks, each substantially similar to chuck 36. Any statistically significant deviations from the expected behavior indicate that the electrostatic chuck 36 undergoing evaluation is defective or that the chuck 36 undergoing evaluation is improperly assembled.

The impedance of electrostatic chuck 36 can be measured under divergent conditions which may severally or jointly provide relevant information regarding the chuck performance. Specifically, the impedance data can be acquired with or without substrate 12 present on the electrostatic chuck 36, with or without heating substrate 12, if present, with or without a plasma present in the vacuum processing space 18, and combinations thereof. For example, before acquiring the impedance data, a plasma can be generated from 10 mTorr of Argon at 750 watts of RF power or generated from 100 mTorr of 96% Helium: 4% Hydrogen at 600 watts of RF power. As another example, the impedance data can be acquired with the substrate heated to a series of substrate temperatures, such as, for example, a temperature series acquired at stabilized temperatures of 150° C., 200° C., 250° C., 280° C. and 300° C.

Figure 5A:
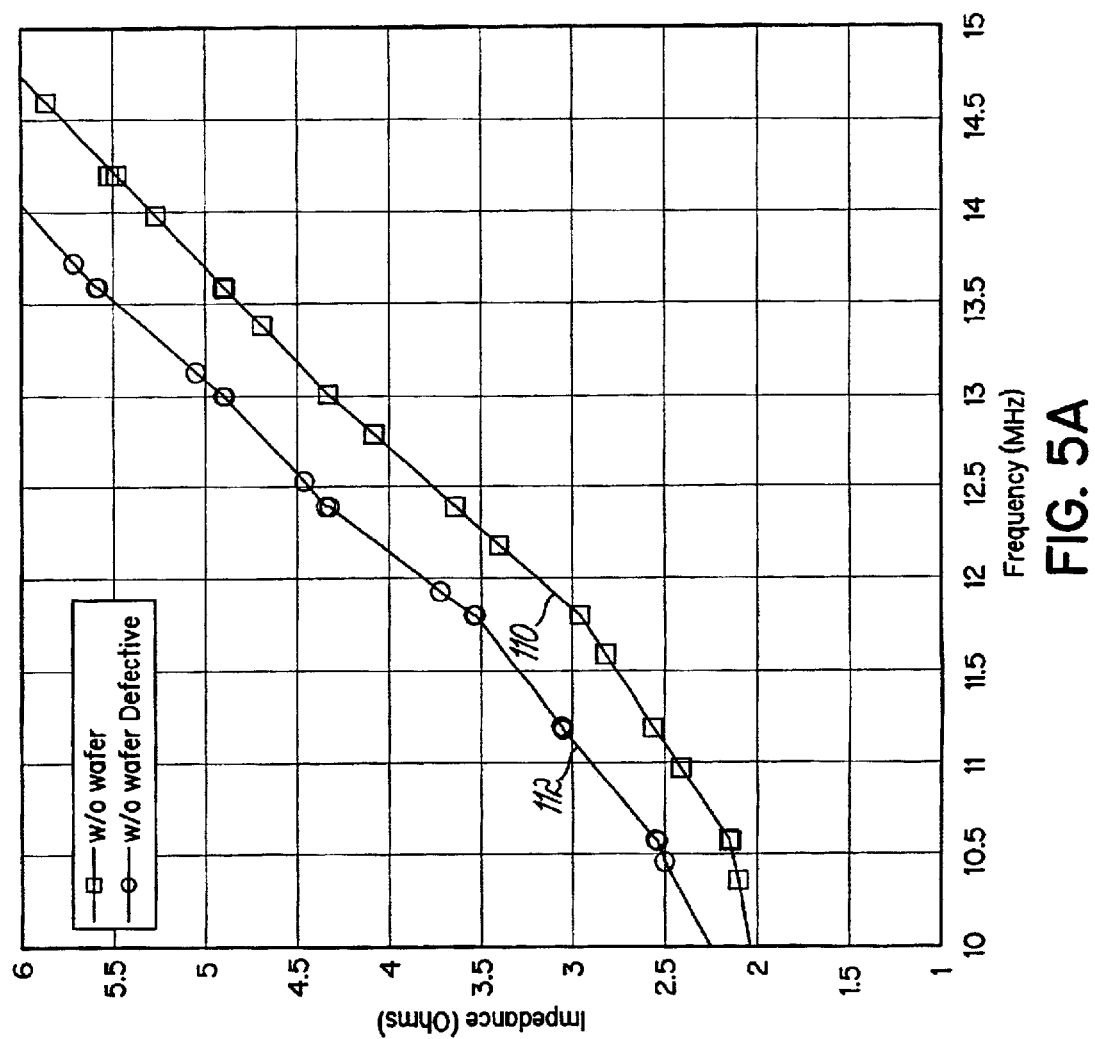
FIG. 5A is a graphical representation of the magnitude of the measured impedance of the chuck.
Figure 5B:
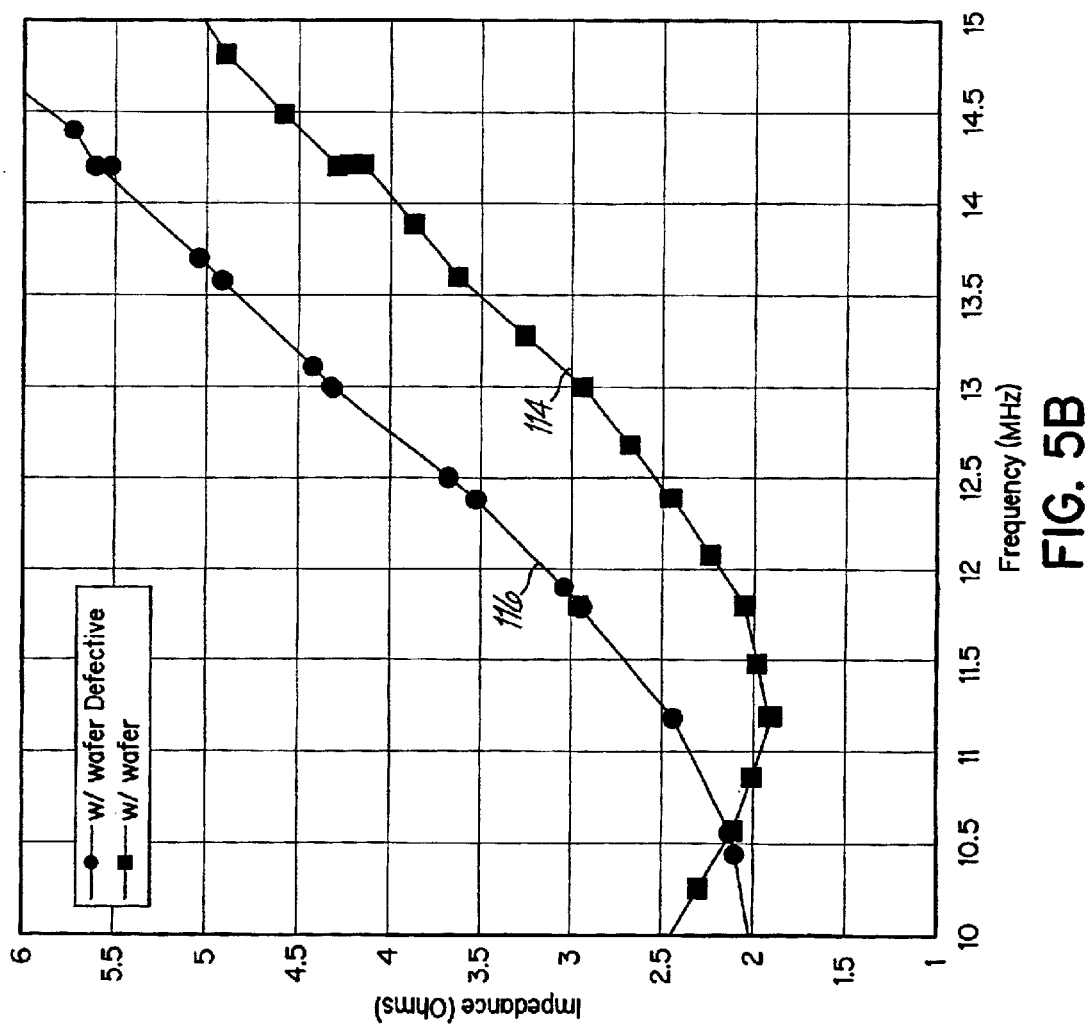
FIG. 5B is a graphical representation of the magnitude of the measured impedance of the chuck with a substrate positioned on the substrate support.

Examples of comparisons of the impedance performance of a defective electrostatic chuck and the impedance performance of another electrostatic chuck, substantially similar in construction and/or configuration to the defective chuck and having an acceptable performance, are illustrated about FIGS. 5A, 5B, 6A and 6B. With reference to FIG. 5A, the magnitude of the measured impedance in ohms is displayed along the left ordinate versus frequency along the abscissa over a frequency range of about 10 MHz to about 15 MHz for a known electrostatic chuck and a defective electrostatic chuck. The known electrostatic chuck has performance parameters which are acceptable for use in a semiconductor processing system in a production line. The defective chuck, as indicated by a curve on FIG. 5A labeled with reference numeral 112, generally exhibits an impedance that is larger over the entire frequency range than the impedance measured for the chuck having a known acceptable performance, labeled with reference numeral 110. The set of target impedance magnitudes of Curve 110 defines a reference impedance magnitude level correlated with satisfactory performance of a reference electrostatic chuck when placed in a vacuum chamber of a semiconductor processing system in a production line and operated under standard conditions of operation. FIG. 5B displays the magnitude of the measured impedance for the two electrostatic chucks of FIG. 5A in which substrate 12 is positioned on the support surface 40 before the impedance is measured. Similar to FIG. 5A, the impedance of the defective chuck, as indicated by the curve in FIG. 5B labeled with reference numeral 116, is generally larger over the frequency range between about 10 MHz and about 15 MHz than the impedance of the known chuck, labeled with reference numeral 114. It is apparent from the significant difference in the mathematical dependence of the magnitude of the impedance as a function of the frequency of the applied excitation signal that a defective chuck, such as the chuck associated with Curves 110 and 114, can be distinguished from a chuck having an acceptable performance, such as the chuck associated with Curves 112 and 116.

Figure 6A:
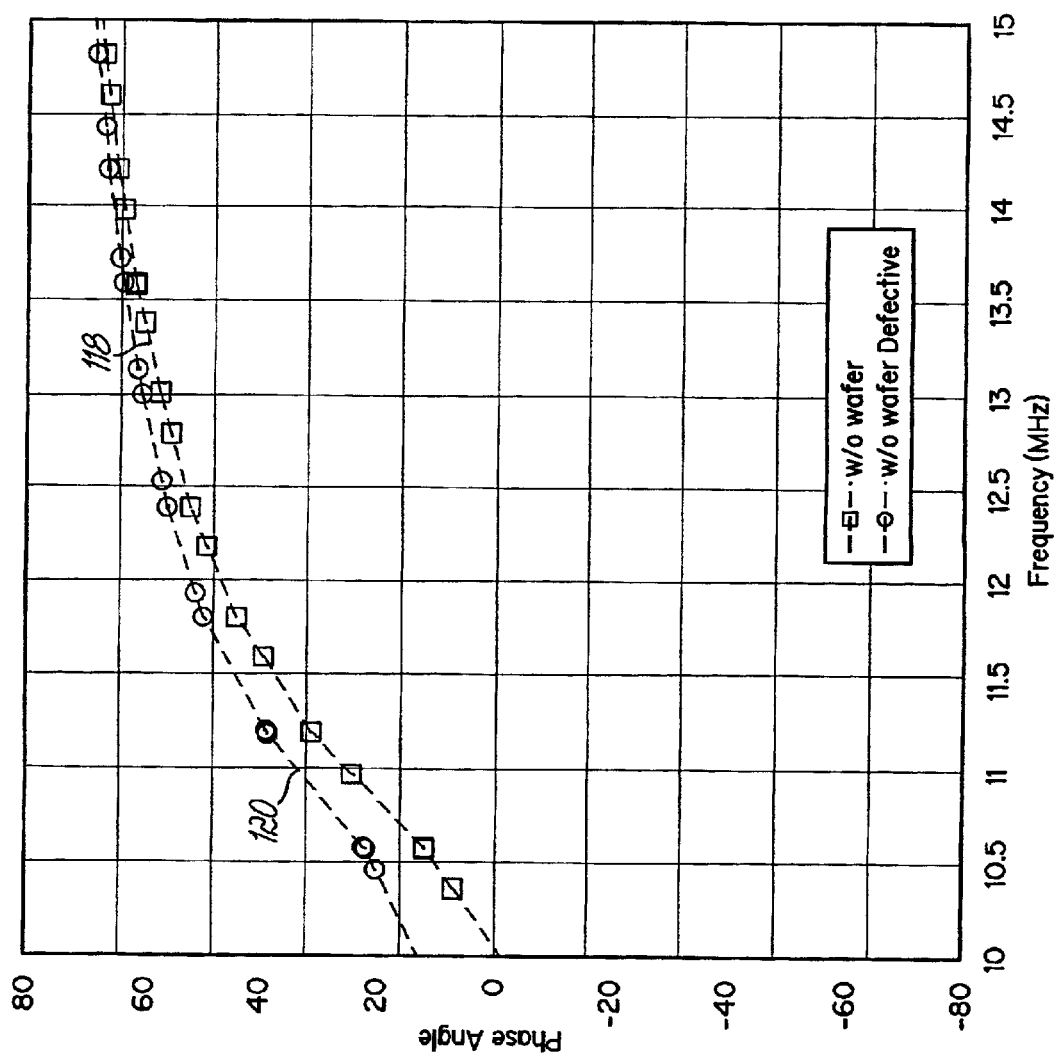
FIG. 6A is a graphical representation of the phase angle of the measured impedance of the chuck.
Figure 6B:
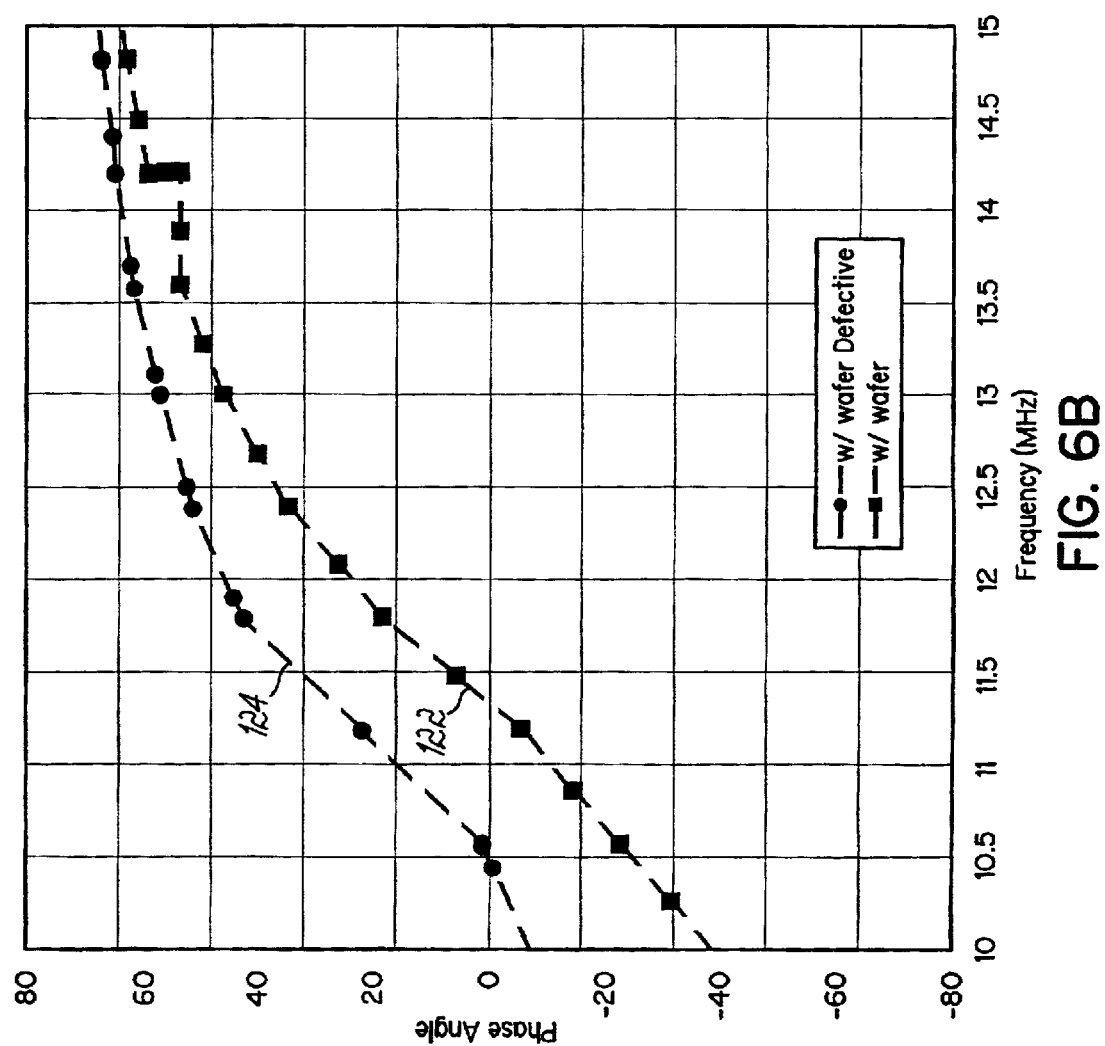
FIG. 6B is a graphical representation of the phase angle of the measured impedance of the chuck with a substrate positioned on the substrate support.

Similarly, with reference to FIG. 6A, the phase angle of the impedance is displayed in degrees along the left ordinate versus frequency along the abscissa for a known electrostatic chuck having a nominally acceptable frequency response and a defective electrostatic chuck having an anomalous response as the frequency is scanned over the range of about 10 MHz to about 15 MHz. As apparent, the frequency dependence of the phase angle for the defective chuck, as indicated by a curve on FIG. 6A labeled with reference numeral 120, differs from the frequency dependence of the phase angle of the known chuck, labeled with reference numeral 118, over the entire frequency range. FIG. 6B displays the measured phase angle of the impedance for the two electrostatic chucks of FIG. 6A in which substrate 12 is positioned on the support surface 40 before the impedance is measured. The frequency dependence of the phase angle of the defective chuck, as indicated by the curve on FIG. 6B labeled with reference numeral 124, is larger over the frequency range between about 10 MHz and about 15 MHz differs from the frequency dependence of the phase angle of the known chuck, labeled with reference numeral 122. The set of target impedance phase angles of Curve 122 define a reference impedance phase angle level correlated with satisfactory performance of a reference electrostatic chuck when placed in a vacuum chamber of a semiconductor processing system in a production line and operated under standard conditions of operation. It is apparent from the significant difference in the mathematical dependence of the phase angle of the impedance as a function of the frequency of the applied excitation signal that a defective chuck, such as the chuck associated with Curves 120 and 124, can be distinguished from a chuck having an acceptable performance, such as the chuck associated with Curves 118 and 122.

Figure 7:
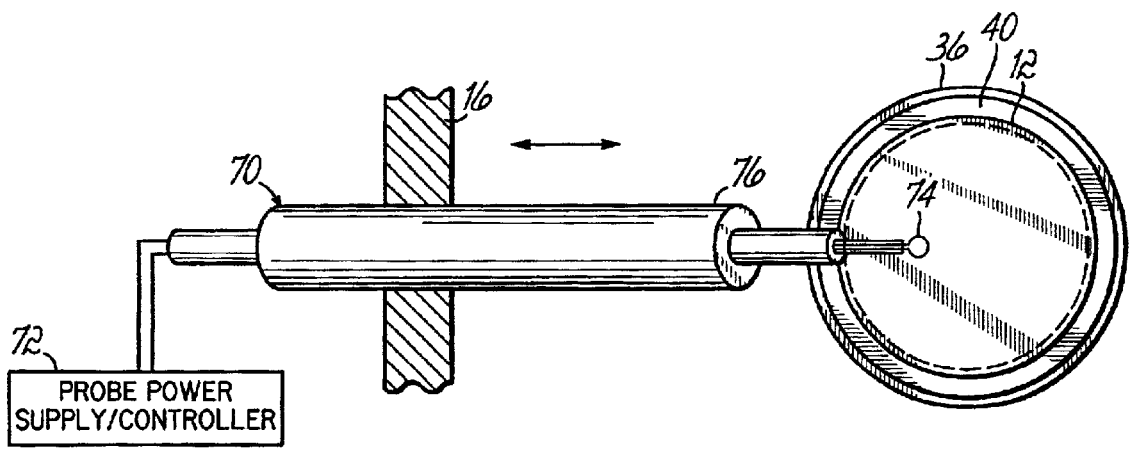
FIG. 7 is an enlarged perspective view of a portion of the semiconductor processing system of FIG. 1.

According to another aspect of the present invention and with reference to FIGS. 1 and 7, the plasma processing system may be provided with a Langmuir probe 70 and a probe power supply/controller 72 having a current indicator. The Langmuir probe 70 is a known apparatus that is operable for determining parameters characterizing the plasma in the plasma processing system 10, such as plasma densities, charged-particle concentrations, and energy distribution functions, in a location proximate the support surface 40 of the electrostatic chuck 36. As best shown in FIG. 7, the Langmuir probe 70 is mounted in a vacuum-tight fashion to an opening provided in the chamber wall 16. The Langmuir probe 70 includes a metallic electrode 74 extending through a stepped-diameter insulating cylinder 76 formed of a dielectric material, such as quartz. The Langmuir probe 70 is moveable radially with respect to the chamber wall 16, in the direction shown by the arrow 78, so that the probe 70 can be moved near the support surface 40 and the uninsulated tip of the electrode 74 inserted into the plasma. The plasma strikes the exposed portion of the electrode 74 and a small current is generated when a collection voltage is applied by the power supply 72. The Langmuir probe 70 is driven by a sweeping voltage from the probe power supply/controller 72, such as a linear sawtooth voltage, that is variable over a given voltage range. During a measurement, the plasma in the vacuum processing space 18 is maintained in a study-state condition so that the current-collection voltage characteristics measured by the Langmuir probe 70 are relatively easy to interpret. The current-collection voltage characteristics of the electrostatic chuck 36 are compared with the current-collection voltage characteristics of a reference electrostatic chuck, substantially similar in construction and/or configuration to chuck 36, that performs satisfactorily when placed in a vacuum chamber of a semiconductor processing system in a production line and operated under standard conditions of operation.

To qualify the performance of the electrostatic chuck 36, substrate 12 is positioned on the dielectric body 38, a clamping voltage is applied from the high-voltage DC power supply 46 to the electrodes 42, 44, and a plasma is induced above the electrostatic chuck 636. The Langmuir probe 70 is positioned at a series of positions between the edge of the substrate 12 and the center of the substrate 12 while suspended above substrate 12 by, for example, about 2 mm. The measurement can be performed either with or without RF power supply 22 energized to generate a plasma in the vacuum processing space. For example, the plasma can be generated from 10 mTorr of Argon with RF power supply 22 providing 750 watts of RF power to antenna 24 or generated from 100 mTorr of 96% Helium: 4% Hydrogen with RF power supply 22 providing 600 watts of RE power to antenna 24. If RF power supply 22 is not energized, a secondary plasma may be formed incidentally in the vacuum processing space 18 by the high potential applied by RF power supply 50 and high-voltage power supply 46 to the electrodes 42, 44 of the electrostatic chuck 36. If RF power supply 22 is energized, the measurements may be performed while, for example, ramping the RF power provided to the plasma from 0 watts to about 1000 watts or provided to the plasma at a single power level.

According to another aspect of the present invention, the performance of the electrostatic chuck 36 may be further characterized by measuring the heating rate or the cooling rate of the chuck 36. To characterize the temperature response of the electrostatic chuck 36, the heating element 55 is used to heat the chuck 36 to a temperature between about 200° C. and about 400° C. After the temperature is stabilized and the electrostatic chuck 36 is thermally equilibrated, the supply of power is discontinued to the heating element 55 and the chuck 36 is allowed to cool. As the electrostatic chuck 36 cools, the temperature of the chuck 36 is temporally monitored at selected intervals by the thermocouple 62 and thermocouple controller 64. An abnormal cooling rate, compared with a typical cooling rate, indicates that the performance of the electrostatic chuck 36 is unsatisfactory. The cooling rate of the electrostatic chuck 36 is compared with the cooling rate of a reference electrostatic chuck, substantially similar in construction and/or configuration to chuck 36, that performs satisfactorily when placed in a vacuum chamber of a semiconductor processing system in a production line and operated under standard conditions of operation.

If a plasma is present in the vacuum processing space 18, the temperature of the electrostatic chuck 36 may increase when the power supply is discontinued to the heating element 55 and any source of cooling for the chuck 36 is disabled. For example, the plasma can be generated from 10 mTorr of Argon with RF power supply 22 providing 750 watts of RF power to antenna 24 or generated from 100 mTorr of 96% Helium: 4% Hydrogen with RF power supply 22 providing 600 watts of RF power to antenna 24. In that instance, the heating rate of the electrostatic chuck 36 would be measured for comparison with the heating rate of a reference electrostatic chuck that performs satisfactorily when placed in a vacuum chamber of a semiconductor processing system in a production line and operated under standard conditions of operation.

The heating rate or cooling rate of the electrostatic chuck 36 may indicate whether the chuck 36 is assembled properly and/or whether a component of the chuck 36 is defective. For example, if the electrostatic chuck 36 is improperly assembled, the chuck 36 may not cool at an expected rate due to one or more discontinuities in the path for thermal conduction of heat. The heating rate or cooing rate may be measured with or without applying a clamping voltage from the high-voltage DC power supply 46 to the electrodes 42, 44, with or without substrate 12 present on support surface 40, with or without RF power from RF power supply 50 applied to the electrodes 42, 44, and combinations thereof. Furthermore, the temperature may be measured at a series of clamping voltages applied by the high-voltage DC power supply 46 to the electrodes 42, 44, at a series of RF powers supplied by RF power supply 50 to the electrostatic chuck 36, or at various RE powers supplied by RF power supply 22 and inductively coupled via antenna 24 to the plasma in the vacuum processing space 18.

A routine for analyzing the performance of an electrostatic chuck (ESC) consistent with the present invention is now described. As discussed above, one or more performance characteristics of the electrostatic chuck are compared with the performance characteristics of a reference electrostatic chuck and, based on the result of the comparing step, it is determined whether the performance of the electrostatic chuck is adequate to install it in the second vacuum chamber of the semiconductor processing system in the production line.

Figure 8:
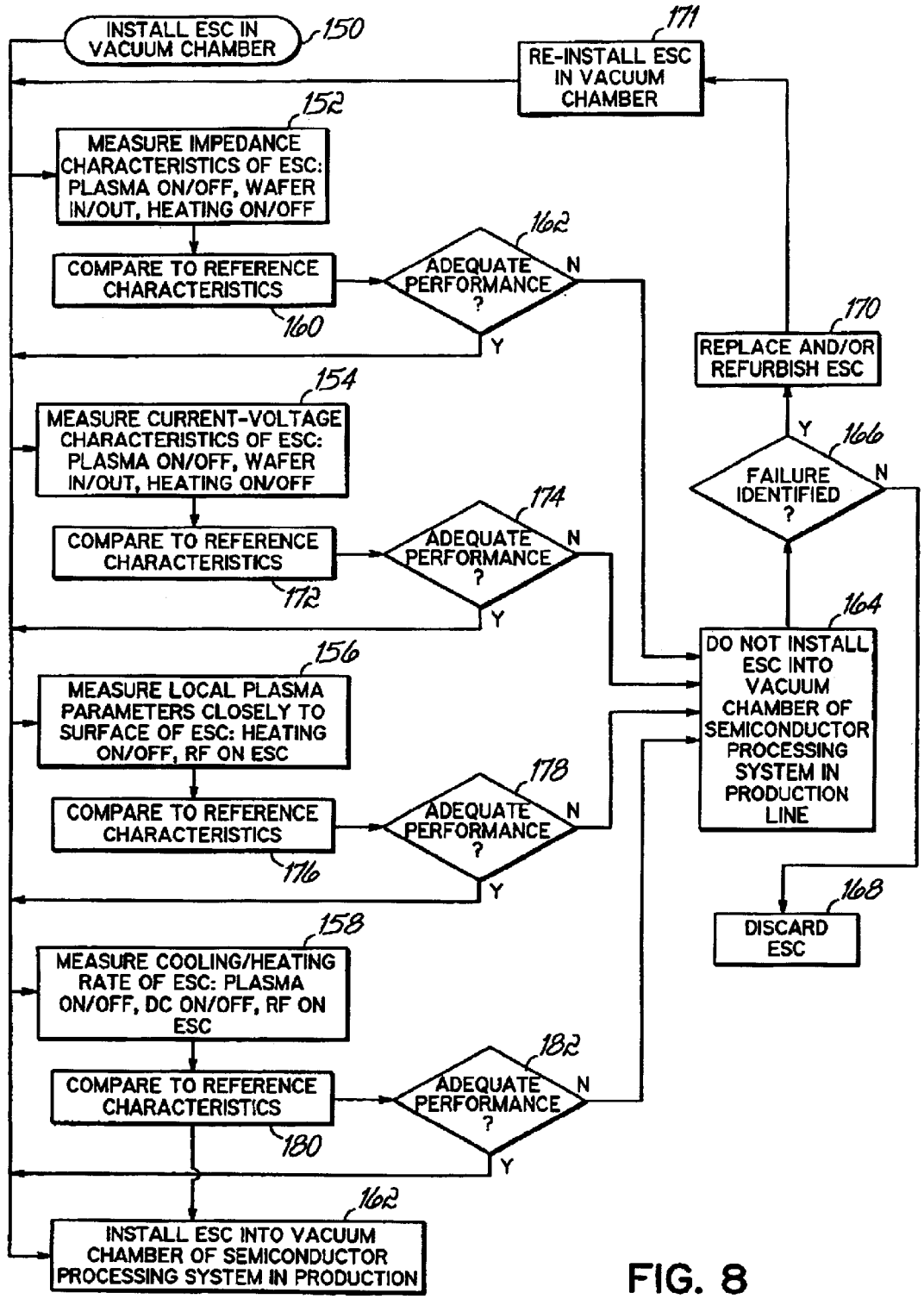
FIG. 8 is a flowchart illustrating the procedural steps of the present invention.

With reference to FIG. 8, a routine for analyzing the performance of an electrostatic chuck is illustrated. The routine begins in block 150 by installing the electrostatic chuck into the vacuum chamber of a semiconductor processing system dedicated to performance analysis. Then, the performance characteristics of the electrostatic chuck are measured by one or more of the impedance characteristics as illustrated in block 152, the current-voltage characteristics as illustrated in block 154, the plasma current-collection voltage characteristics as illustrated in block 156, and the heating/cooling characteristics as illustrated in block 158. Then, based upon the results of the measurement(s), the electrostatic chuck is either discarded or installed into the vacuum chamber of a semiconductor processing system in a production line.

If the routine is initiated by measuring the impedance characteristics of the electrostatic chuck as illustrated in block 152, the impedance can be measured with or without a plasma present in the processing chamber, with or without a wafer present on the substrate support, with or without the chuck heated, or combinations of these conditions. The impedance is acquired by selecting a plurality of frequencies within a defined frequency range and applying a signal across an electrode of the electrostatic chuck at each of the plurality of frequencies, one frequency at a time. The impedance of the electrostatic chuck is measured at each of the plurality of frequencies to generate a set of actual impedances. As illustrated in block 160, the magnitudes and/or phases of the actual impedances are compared with the magnitudes and phases of a set of target impedances defining a reference impedance level correlated with satisfactory performance of a reference electrostatic chuck when placed in the vacuum chamber of the semiconductor processing system in the production line and operated under standard conditions of operation. The comparison provides an indication of the performance of the electrostatic chuck.

Next, in response to the result of the comparison, a decision is made in block 162. If the performance is deemed to be adequate, a second performance characteristic chosen from the current-voltage characteristics as illustrated in block 154, the plasma current-collection voltage characteristics as illustrated in block 156, and the heating/cooling characteristics as illustrated in block 158 can be assessed. Alternatively, as illustrated in block 162, the electrostatic chuck can be installed into a vacuum chamber of a semiconductor processing system in a production line. If the performance is deemed to be inadequate, the electrostatic chuck is not installed into the vacuum chamber of the semiconductor processing system in the production line as illustrated in block 164. A decision is then made in block 166 which results in the chuck either being discarded, as illustrated in block 168, or having the failure identified. If the failure is not identifiable, the electrostatic chuck may be discarded in block 168. If the failure is identifiable and repair is appropriate, the electrostatic chuck may be replaced and/or refurbished, as illustrated in block 170, and reinstalled, as illustrated in block 171, into the vacuum chamber of the semiconductor processing system dedicated to performance analysis, and the analysis routine is reiterated.

If the routine is initiated by measuring the current-voltage characteristics of the electrostatic chuck as illustrated in block 154, the current as a function of applied voltage can be measured with or without a plasma present in the processing chamber, with or without a wafer present on the substrate support, with or without the chuck heated, or combinations of these conditions. The impedance is acquired by selecting a range of voltages and applying each voltage to the electrode, one voltage at a time, to the electrode of the electrostatic. The current flowing to the electrode of the electrostatic chuck is measured at each applied voltage to generate a set of actual currents. As illustrated in block 172, the actual currents are compared with a set of target currents defining a reference current level correlated with satisfactory performance of a reference electrostatic chuck when placed in the vacuum chamber of the semiconductor processing system in the production line and operated under standard conditions of operation. The comparison provides an indication of the performance of the electrostatic chuck.

Next, in response to the result of the comparison, a decision is made in block 174. If the performance is deemed to be adequate, a second performance characteristic chosen from the impedance characteristics as illustrated in block 152, the plasma current-collection voltage characteristics as illustrated in block 156, and the heating/cooling characteristics as illustrated in block 158 can be assessed. Alternatively, as illustrated in block 162, the electrostatic chuck can be installed into a vacuum chamber of a semiconductor processing system in a production line. If the performance is deemed to be inadequate, the electrostatic chuck is not installed into the vacuum chamber of the semiconductor processing system in the production line as illustrated in block 164. A decision is then made in block 166 which results in the chuck either being discarded, as illustrated in block 168, or having the failure identified. If the failure is not identifiable, the electrostatic chuck may be discarded in block 168. If the failure is identifiable and repair is appropriate, the electrostatic chuck may be replaced and/or refurbished, as illustrated in block 170, and reinstalled, as illustrated in block 171, into the vacuum chamber of the semiconductor processing system dedicated to performance analysis, and the analysis routine is reiterated.

If the routine is initiated by measuring the plasma current-collection voltage characteristics of the electrostatic chuck as illustrated in block 156, a substrate is placed on the support surface of the electrostatic chuck, a plasma is established in the processing chamber, and the plasma current detected by a Langmuir probe is measured as a function of applied collection voltage. The plasma current can be measured with or without the chuck heated, with or without an RF voltage applied to the substrate support, or combinations of these conditions. The plasma current is acquired by selecting at least one predetermined position proximate an exposed surface of the substrate, positioning an electrode of the Langmuir probe adjacent the predetermined position, applying a collection voltage to the electrode, and measuring the current flowing from the plasma to the Langmuir probe. As illustrated in block 176, the measured current is compared with a target current defining a reference current level correlated with satisfactory performance of a reference electrostatic chuck when placed in the vacuum chamber of the semiconductor processing system in the production line and operated under standard conditions of operation. The comparison provides an indication of the performance of the electrostatic chuck. predetermined position proximate an exposed surface of the substrate, positioning an electrode of the Langmuir probe adjacent the predetermined position, applying a collection voltage to the electrode, and measuring the current flowing from the plasma to the Langmuir probe. As illustrated in block 176, the measured current is compared with a target current defining a reference current level correlated with satisfactory performance of a reference electrostatic chuck when placed in the vacuum chamber of the semiconductor processing system in the production line and operated under standard conditions of operation. The comparison provides an indication of the performance of the electrostatic chuck.

Next, in response to the result of the comparison, a decision is made in block 178. If the performance is deemed to be adequate, a second performance characteristic chosen from the impedance characteristics as illustrated in block 152, the current-voltage characteristics as illustrated in block 154, and the heating/cooling characteristics as illustrated in block 158 can be assessed. Alternatively, as illustrated in block 162, the electrostatic chuck can be installed into a vacuum chamber of a semiconductor processing system in a production line. If the performance is deemed to be inadequate, the electrostatic chuck is not installed into the vacuum chamber of the semiconductor processing system in the production line as illustrated in block 164. A decision is then made in block 166 which results in the chuck either being discarded, as illustrated in block 168, or having the failure identified. If the failure is not identifiable, the electrostatic chuck may be discarded in block 168. If the failure is identifiable and repair is appropriate, the electrostatic chuck may be replaced and/or refurbished, as illustrated in block 170, and reinstalled, as illustrated in block 171, into the vacuum chamber of the semiconductor processing system dedicated to performance analysis, and the analysis routine is reiterated.

If the routine is initiated by measuring the heating/cooling characteristics as illustrated in block 158, the temperature profile of the electrostatic chuck may be measured with or without a plasma present in the processing chamber, with or without a clamping voltage applied to the wafer on the substrate support, with or without an RF voltage applied to the substrate support, or combinations of these conditions. The temperature profile is acquired by establishing the temperature of the electrostatic chuck at a predetermined temperature, discontinuing the temperature regulation, and measuring the change in the temperature of the electrostatic chuck as a function of time to create the temperature profile. As illustrated in block 180, the actual temperature profile is compared with a target temperature profile defining a reference temperature profile correlated with satisfactory performance of a reference electrostatic chuck when placed in the vacuum chamber of the semiconductor processing system in the production line and operated under standard conditions of operation. The comparison provides an indication of the performance of the electrostatic chuck.

Next, in response to the result of the comparison, a decision is made in block 182. If the performance is deemed to be adequate, a second performance characteristic chosen from the impedance characteristics as illustrated in block 152, the current-voltage characteristics as illustrated in block 154, and the plasma current-collection voltage characteristics as illustrated in block 156 can be assessed. Alternatively, as illustrated in block 162, the electrostatic chuck can be installed into a vacuum chamber of a semiconductor processing system in a production line. If the performance is deemed to be inadequate, the electrostatic chuck is not installed into the vacuum chamber of the semiconductor processing system in the production line as illustrated in block 164. A decision is then made in block 166 which results in the chuck either being discarded, as illustrated in block 168, or having the failure identified. If the failure is not identifiable, the electrostatic chuck may a discarded in block 168. If the failure is identifiable and repair is appropriate, the electrostatic chuck may be replaced and/or refurbished, as illustrated in block 170, and reinstalled, as illustrated in block 171, into the vacuum chamber of the semiconductor processing system dedicated to performance analysis, and the analysis routine is reiterated.

The performance tests of the present invention permit a determination of the performance characteristics of an electrostatic chuck before that chuck is installed in the process chamber of a semiconductor processing system in a production line. The results of each test provide information concerning the performance of the electrostatic chuck under investigation that can be empirically compared with the performance of a known electrostatic chuck. Specifically, the current-voltage characteristics, the impedance characteristics, the plasma current-collection voltage characteristics, and the heating/cooling characteristics of an electrostatic chuck may be measured and utilized individually, collectively, serially, or in various combinations to assess the performance of a given electrostatic chuck before that chuck is installed in the process chamber of a semiconductor processing system in a production line. Electrostatic chucks having inadequate performance compared to the performance of a reference chuck of similar or identical configuration and/or construction and tested under substantially similar conditions, may be discarded, either with or without salvaging useful components, or repaired or refurbished in an attempt to correct the defect, which may originate from a flawed chuck assembly or a defective chuck component. The tests may be used as diagnostic tests for determining the specific origin of a defect that degrades the performance of an electrostatic chuck.

While the present invention has been illustrated by the description of embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicants' general inventive concept.

Accordingly, what is claimed is:

1. A method of characterizing the performance of an electrostatic chuck in a first vacuum chamber for use in a second vacuum chamber of a semiconductor processing system in a production line, the method comprising:

providing a first reference value of a first performance characteristic correlated with satisfactory performance of a reference electrostatic chuck when placed in the second vacuum chamber of the semiconductor processing system in the production line and operated under standard conditions of operation;

positioning the electrostatic chuck within the first vacuum chamber;

measuring a first measured value for the first performance characteristic of the electrostatic chuck;

comparing the first measured value of the first performance characteristic with the first reference value, the comparison providing an indication of the performance of the electrostatic chuck; and based on the result of the comparing step, determining whether the performance of the electrostatic chuck is adequate to install the electrostatic chuck in the second vacuum chamber of the semiconductor processing system in the production line.

2. The method of claim 1, further comprising, prior to the step of measuring, the step of placing a substrate in a supported position on a support surface of the electrostatic chuck.

3. The method of claim 2, further comprising, before the step of measuring, the steps of generating a plasma in the first vacuum chamber and exposing the substrate to the generated plasma.

4. The method of claim 3, further comprising, prior to the step of measuring, the step of applying an RF bias potential to the electrostatic chuck to attract charged particles from the plasma to a surface of the substrate.

5. The method of claim 2, further comprising, prior to the step of measuring, the step of applying a clamping voltage to the electrostatic chuck to create an attractive force that clamps the substrate to the support surface.

6. The method of claim 1, further comprising, before the step of measuring, the step of heating the electrostatic chuck to a predetermined temperature.

7. The method of claim 1, wherein the first performance characteristic is selected from the group consisting of a current-voltage characteristic, an impedance characteristic, a plasma current-collection voltage characteristic, and a heating/cooling characteristic.

8. The method of claim 1, further comprising, after the step of comparing and before the step of determining, the steps of:

providing a second reference value of a second performance characteristic correlated with satisfactory performance of a reference electrostatic chuck when placed in the second vacuum chamber of the semiconductor processing system in the production line and operated under standard conditions of operation;

measuring a second value for the second performance characteristic of the electrostatic chuck;

comparing the second measured value of the second performance characteristic with the second reference value, the comparison providing an indication of the performance of the electrostatic chuck; and based on the result of the comparing step, determining whether the performance of the electrostatic chuck is adequate to install the electrostatic chuck in the second vacuum chamber of the semiconductor processing system in the production line.

9. The method of claim 8, wherein the second performance characteristic is selected from the group consisting of a current-voltage characteristic, an impedance characteristic, a plasma current-collection voltage characteristic, and a heating/cooling characteristic.

10. The method of claim 1, further comprising, after the step of comparing and before the step of determining, the steps of:

providing a second reference value of the first performance characteristic correlated with satisfactory performance of a reference electrostatic chuck when placed in the second vacuum chamber of the semiconductor processing system in the production line and operated under standard conditions of operation;

measuring a second value for the first performance characteristic of the electrostatic chuck;

comparing the second measured value of the first performance characteristic with the second reference value, the comparison providing an indication of the performance of the electrostatic chuck; and based on the result of the comparing step, determining whether the performance of the electrostatic chuck is adequate to install the electrostatic chuck in the second vacuum chamber of the semiconductor processing system in the production line.

11. The method of claim 1, further comprising, after the step of determining, installing the electrostatic chuck in the second vacuum chamber of the semiconductor processing system in the production line.

12. A method of characterizing the performance of an electrostatic chuck in a first vacuum chamber for use in a second vacuum chamber of a semiconductor processing system in a production line, the electrostatic chuck having an electrode, the method comprising:

providing a set of target impedances defining a reference impedance level correlated with satisfactory performance of a reference electrostatic chuck when placed in the second vacuum chamber of the semiconductor processing system in the production line and operated under standard conditions of operation;

positioning the electrostatic chuck within the first vacuum chamber selecting a plurality of frequencies within a defined frequency range;

applying a signal across the electrode of the electrostatic chuck at each of the plurality of frequencies, one frequency at a time;

measuring the impedance of the electrostatic chuck in response to the signal at each of the plurality of frequencies to generate a set of actual impedances;

comparing the actual impedances with the set of target impedances for the range of frequencies, the comparison providing an indication of the performance of the electrostatic chuck; and based on the result of the comparing step, determining whether the performance of the electrostatic chuck is adequate to install the electrostatic chuck in the second vacuum chamber of the semiconductor processing system in the production line.

13. The method of claim 12, further comprising, prior to the step of applying the signal, the step of placing a substrate in a supported position on a support surface of the electrostatic chuck.

14. The method of claim 13, further comprising, before the step of measuring the impedance, the steps of generating a plasma in the first vacuum chamber and exposing the substrate to the generated plasma.

15. The method of claim 12, wherein the electrostatic chuck is a bipolar electrostatic chuck.

16. The method of claim 12, further comprising, before the step of applying, the step of disconnecting any RF power supply that is electrically connected to the electrostatic chuck.

17. The method of claim 12, wherein the step of measuring the impedance provides a measurement selected from the group consisting of magnitude and phase angle.

18. A method of characterizing the performance of an electrostatic chuck in a first vacuum chamber for use in a second vacuum chamber of a semiconductor processing system in a production line, the electrostatic chuck having an electrode, the method comprising:

providing a set of target currents defining a reference leakage current level correlated with satisfactory performance of a reference electrostatic chuck when placed in the second vacuum chamber of the semiconductor processing system in the production line and operated under standard conditions of operation;

positioning the electrostatic chuck within the first vacuum chamber;

selecting a range of voltages;

applying each voltage to the electrode of the electrostatic chuck, one voltage at a time;

measuring a current flowing to the electrode at each applied voltage to generate a set of actual currents;

comparing the set of actual currents with the set of target currents for the range of voltages, the comparison providing an indication of the performance of the electrostatic chuck; and based on the result of the comparing step, determining whether the performance of the electrostatic chuck is adequate to install the electrostatic chuck in the second vacuum chamber of the semiconductor processing system in the production line.

19. The method of claim 18, further comprising, prior to the step of applying the voltage, the step of placing a substrate in a supported position on a support surface of the electrostatic chuck.

20. The method of claim 19, further comprising, prior to the step of applying the voltage, the steps of generating a plasma in the first vacuum chamber and exposing the substrate to the generated plasma.

21. The method of claim 18, wherein the electrostatic chuck is a bipolar electrostatic chuck.

22. The method of claim 21, wherein the signal is applied to two electrodes of the bipolar electrostatic chuck.

23. The method of claim 18, further comprising, before the step of applying, the step of heating the electrostatic chuck to a first predetermined temperature.

24. The method of claim 23, further comprising, after the step of measuring, the step of heating the electrostatic chuck to a second predetermined temperature that differs from the first predetermined temperature and repeating the steps of applying and measuring.

25. A method of characterizing the performance of an electrostatic chuck in a first vacuum chamber for use in a second vacuum chamber of a semiconductor processing system in a production line, the electrostatic chuck having a support surface, the method comprising:

providing a target current defining a reference current level correlated with satisfactory performance of a reference electrostatic chuck when placed in the second vacuum chamber of the semiconductor processing system in the production line and operated under standard conditions of operation;

positioning the electrostatic chuck within the first vacuum chamber;

placing a substrate on the support surface of the electrostatic chuck;

selecting a predetermined position proximate an exposed surface of the substrate;

positioning an electrode of a Langmuir probe adjacent the predetermined position;

applying a collection voltage to the electrode of the Langmuir probe;

measuring the current flowing from the plasma to the Langmuir probe;

comparing the measured current with the target current, the comparison providing an indication of the performance of the electrostatic chuck; and based on the result of the comparing step, determining whether the performance of the electrostatic chuck is adequate to install the electrostatic chuck in the second vacuum chamber of the semiconductor processing system in the production life.

26. The method of claim 25, further comprising repeating the steps of applying and measuring for a plurality of collection voltages to provide an array of currents flowing from the plasma to the Langmuir probe as a function of collection voltage, and the step of comparing comprises comparing the array of measured currents to an array of target currents to provide an indication of the performance of the electrostatic chuck.

27. The method of claim 25, further comprising, repeating the steps of selecting, positioning, applying, measuring, and comparing for a plurality of predetermined positions to generate an array of currents flowing from the plasma to the Langmuir probe as a function of predetermined position, and wherein the step of comparing comprises comparing the array of measured currents to an array of target currents to provide an indication of the performance of the electrostatic chuck.

28. The method of claim 25, further comprising, prior to the step of measuring the current, the step of applying an RF bias potential to the electrostatic chuck to attract charged particles from the plasma to the surface of the substrate.

29. The method of claim 25, further comprising, prior to the step of measuring the current, the step of applying a clamping voltage to the electrostatic chuck to create an attractive force that clamps the substrate to the support surface.

30. The method of claim 25, wherein the predetermined position is between the center of the substrate and the outer peripheral edge of the substrate.

31. The method of claim 25, further comprising, before the step of applying, the step of heating the electrostatic chuck to a predetermined temperature.

32. A method of characterizing the performance of an electrostatic chuck in a first vacuum chamber for use in a second vacuum chamber of a semiconductor processing system in a production line, the electrostatic chuck capable of being temperature regulated, the processing system having a vacuum chamber, the method comprising:

providing a target temperature profile defining a reference temperature profile correlated with satisfactory performance of a reference electrostatic chuck when placed in the second vacuum chamber of the semiconductor processing system in the production line and operated under standard conditions of operation;

positioning the electrostatic chuck within the first vacuum chamber;

establishing the temperature of the electrostatic chuck at a predetermined temperature, discontinuing the temperature regulation of the electrostatic chuck;

measuring the change in the temperature of the electrostatic chuck as a function of time to create a temperature profile; and comparing the measured temperature profile with the target temperature profile, the comparison providing an indication of the performance of the electrostatic chuck; and based on the result of the comparing step, determining whether the performance of the electrostatic chuck is adequate to install the electrostatic chuck in the second vacuum chamber of the semiconductor processing system in the production line.

33. The method of claim 32, further comprising, before the step of measuring, the step of generating a plasma by applying a first RF power to excite a pressure of a process gas provided in the first vacuum chamber.

34. The method of claim 33, further comprising, after the step of measuring, the step of generating a plasma by applying a second RF power to excite the pressure of the process gas provided in the first vacuum chamber, the second RF power differing from the first RF power, and repeating the steps of establishing, discontinuing, and measuring.

35. The method of claim 33, further comprising, before the step of measuring, the steps of placing a substrate in a supported position on a support surface of the electrostatic chuck, and applying an RF bias potential at a first voltage level to the electrostatic chuck to attract charged particles from the plasma to a surface of the substrate.

36. The method of claim 35, further comprising, after the step of measuring, the step of applying an RF bias potential at a second voltage level to the electrostatic chuck to attract charged particles from the plasma to the surface of the substrate, the second voltage level differing from the first voltage level, and repeating the steps of establishing, discontinuing, and measuring.

37. The method of claim 33, wherein the temperature of the electrostatic chuck increases as a function of time.

38. The method of claim 32, further comprising, before the step of measuring, the step of placing a substrate in a supported position on a support surface of the electrostatic chuck.

39. The method of claim 38, further comprising the step of applying a DC voltage at a first voltage level to the electrode of the electrostatic chuck to clamp the substrate to the support surface.

40. The method of claim 39, further comprising, after the step of measuring, the step of applying a DC voltage at a second voltage level to the electrostatic chuck to attract charged particles from the plasma to a surface of the substrate, the second voltage level differing from the first voltage level, and repeating the steps of establishing, discontinuing, and measuring.

41. The method of claim 32, wherein the temperature of the electrostatic chuck decreases as a function of time.

\* \* \* \* \*

UNITED STATES PATENT AND TRADEMARK OFFICE
CERTIFICATE OF CORRECTION

PATENT NO. : 6,853,953 B2
DATED : February 8, 2005
INVENTOR(S) : Brcka et al.

It is certified that error appears in the above-identified patent and that said Letters Patent is hereby corrected as shown below:

Title page,
Item [56], References Cited, U.S. PATENT DOCUMENTS, "Desai et al." should read -- Poliniak et al. --.

Column 2,
Line 45, "m" should read -- in --.
Line 51, "determining" should read -- determined --.

Column 6,
Line 9, "(Gilbert Ariz.)" should read -- (Gilbert, Ariz.) --.
Line 40, "farce" should read -- force --.

Column 10,
Line 60, "discreet" should read -- discrete --.

Column 11,
Line 24, "arc" should read -- are --.

Column 12,
Line 51, "study" should read -- steady --.
Line 66, "636" should read -- 36 --.

Column 13,
Line 9, "RE power" should read -- RF power --.
Line 62, "cooing" should read -- cooling --.

Column 14,
Line 5, "RE power" should read -- RF power --.

Column 15,
Line 20, "the electrostatic" should read -- the electrostatic chuck --.

Column 16,
Lines 10-22, "predetermined position … chuck." should be removed.

UNITED STATES PATENT AND TRADEMARK OFFICE
CERTIFICATE OF CORRECTION

PATENT NO. : 6,853,953 B2
DATED : February 8, 2005
INVENTOR(S) : Brcka et al.

It is certified that error appears in the above-identified patent and that said Letters Patent is hereby corrected as shown below:

Column 19,
Line 36, "chamber" should read -- chamber; --.

Column 21,
Line 16, "life" should read -- line --.

Column 22,
Line 2, "temperature," should read -- temperature; --.

Signed and Sealed this

Thirtieth Day of August, 2005

JON W. DUDAS
*Director of the United States Patent and Trademark Office*